United States Patent [19]

Berman

[11] Patent Number: 5,054,519

[45] Date of Patent: Oct. 8, 1991

[54] RECIRCULATING CHEMICAL BATH WITH INFLOW AND SELF BALANCING OUTFLOW

[75] Inventor: Allan Berman, Sunnyvale, Calif.

[73] Assignee: Imtec Products, Inc., Sunnyvale, Calif.

[21] Appl. No.: 633,690

[22] Filed: Dec. 26, 1990

[51] Int. Cl.$^5$ .............................................. E03B 7/07
[52] U.S. Cl. .................................. 137/563; 137/565; 137/574; 137/593; 118/429
[58] Field of Search ............... 137/334, 341, 563, 565, 137/571, 573, 574, 590, 593; 118/429

[56] References Cited

U.S. PATENT DOCUMENTS

| | | | |
|---|---|---|---|
| 1,457,121 | 5/1923 | Mudge | 137/590.5 |
| 2,860,785 | 11/1958 | Gardner | 137/563 |
| 3,033,712 | 5/1962 | Brevick | 134/34 |
| 3,851,662 | 12/1974 | Jessop | 137/563 |
| 3,987,816 | 10/1976 | Lange | 137/563 |
| 4,090,530 | 5/1978 | Lange | 137/563 |
| 4,506,986 | 3/1985 | Freeman | 137/563 |
| 4,650,339 | 3/1987 | Chetcuti et al. | 137/565 |
| 4,804,990 | 2/1989 | Jessop | 137/565 |

Primary Examiner—A. Michael Chambers
Attorney, Agent, or Firm—Harris Zimmerman

[57] ABSTRACT

A chemical bath in which batches of integrated circuit wafers or other articles are immersed in hot liquid chemical during manufacture has a processing vessel, an adjacent sump vessel and a trough which carries overflow from the processing vessel to the sump vessel. A pump continuously recirculates liquid from the sump vessel to the processing vessel through a filter. A continuous inflow of liquid is received from a liquid chemical source and an intermittent outflow occurs through an outlet at an upper region of the sump vessel. The liquid chemical source may, for example, supply make-up fluid or be a reprocessor that repurifies the outflow from the sump vessel. The storage capacity of the sump vessel below the outlet is greater than that needed to contain the volume of liquid that is displaced in the processing vessel by the batch of wafers. This avoids pump starvation when liquid level is lowered in the processing vessel by removal of a batch of wafers and also assures that outflow matches inflow from the liquid chemical source over a period of time without requiring flow sensing devices, dynamic valving or other complications.

13 Claims, 3 Drawing Sheets

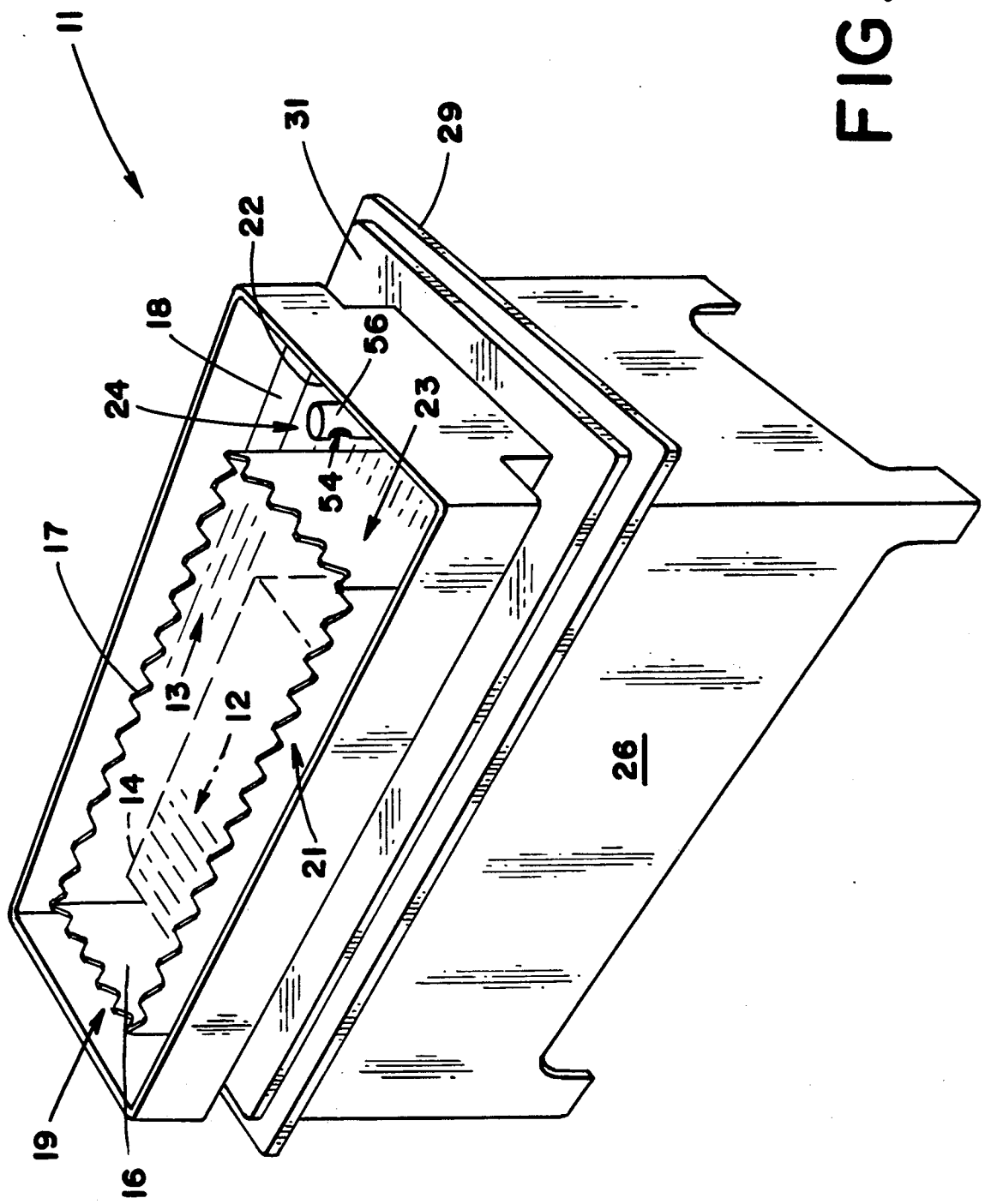

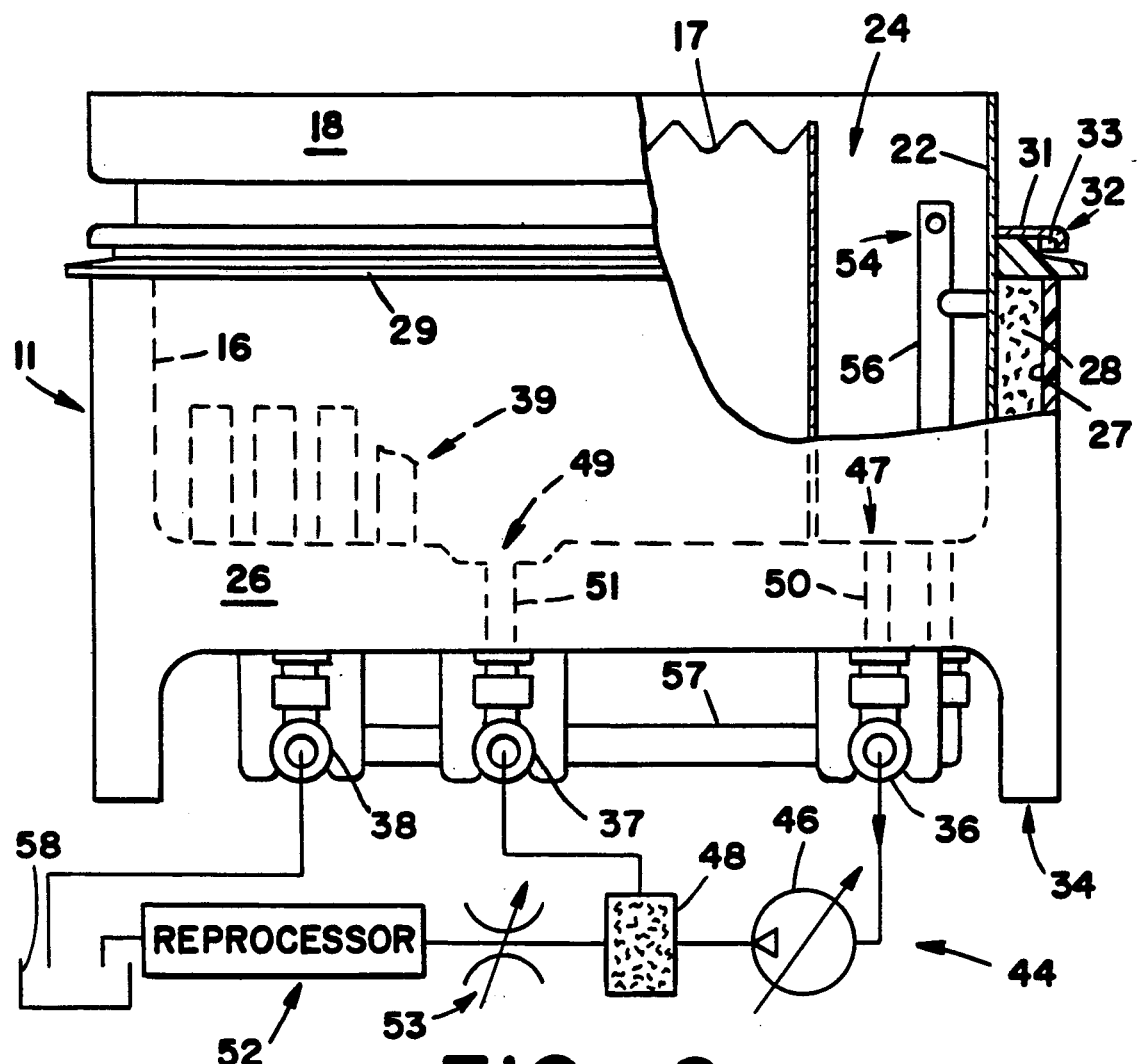
FIG_2
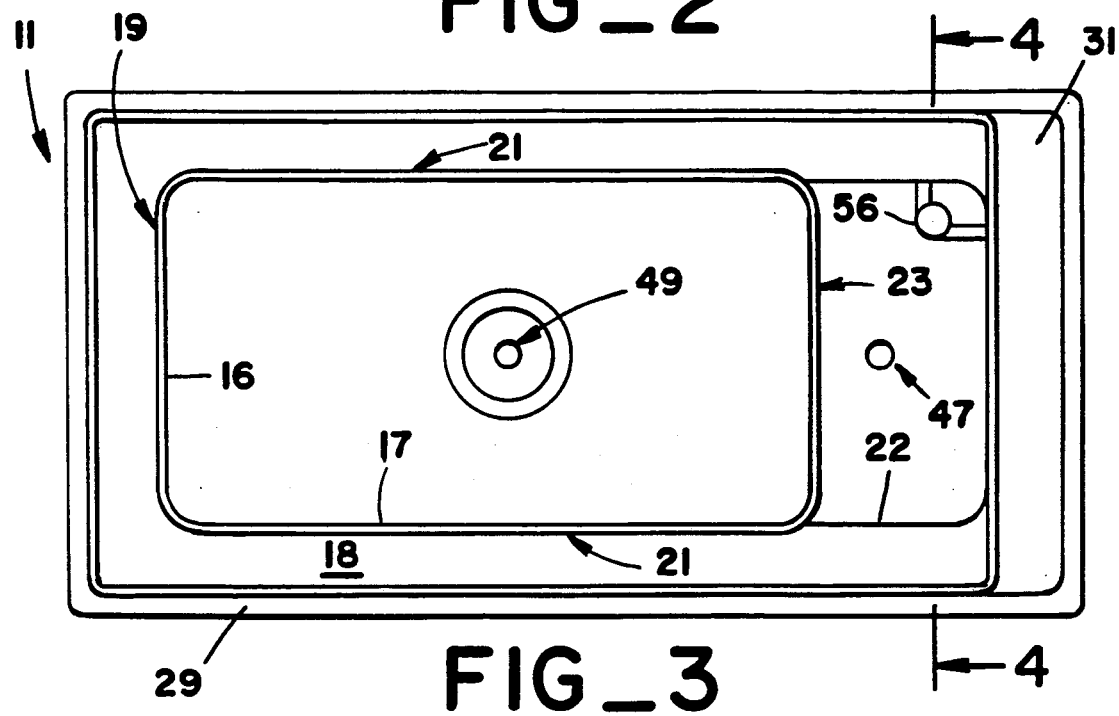
FIG_3

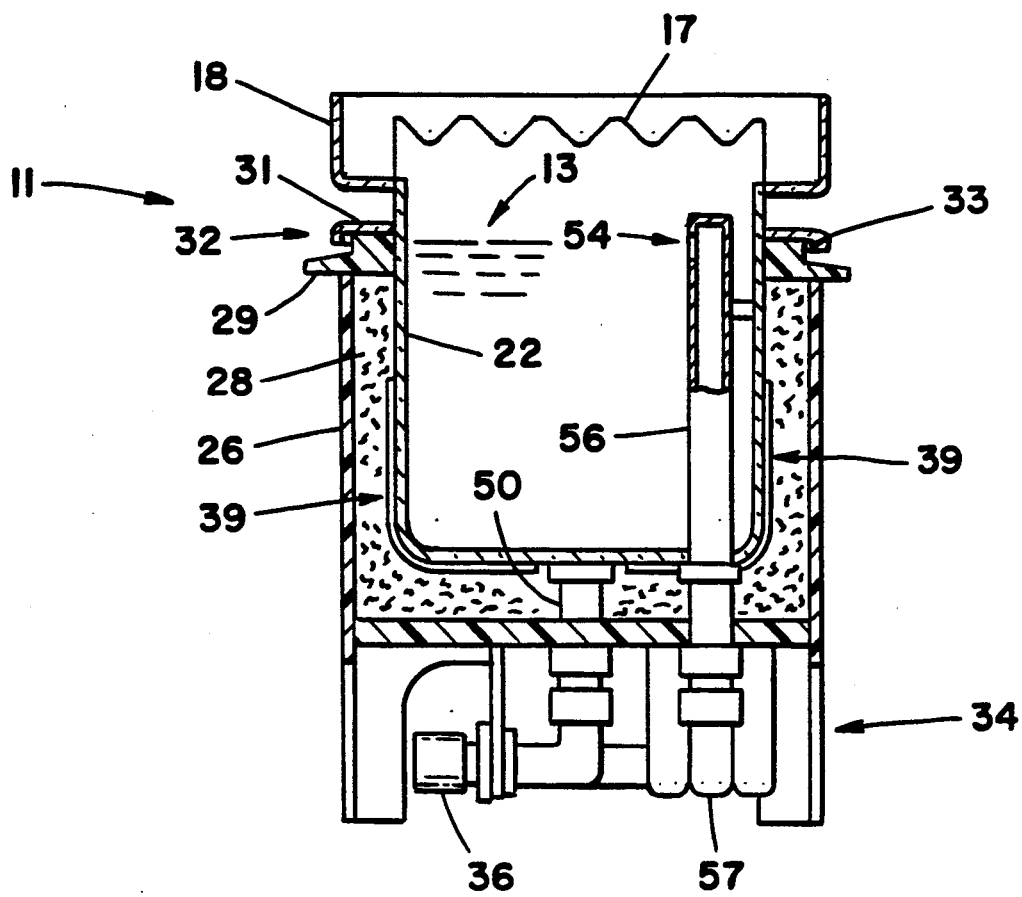
FIG_4
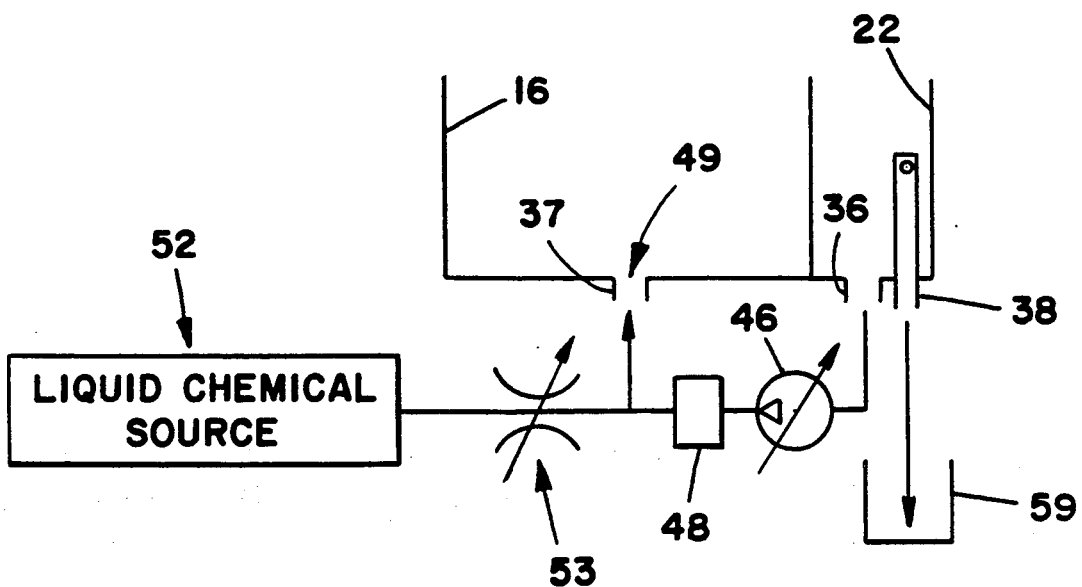
FIG_5

5,054,519

RECIRCULATING CHEMICAL BATH WITH INFLOW AND SELF BALANCING OUTFLOW

TECHNICAL FIELD

This invention relates to chemical baths for immersing articles in liquid chemicals during manufacturing procedures and more particularly to chemical baths in which the liquid is withdrawn, filtered and recirculated through the bath and in which an inflow of liquid is also received from an external source.

BACKGROUND OF THE INVENTION

A variety of manufacturing processes require that successive batches of a product be temporarily immersed in a liquid chemical. In the semiconductor industry, for example, operations such as etching and cleaning of integrated circuit wafers require processing steps of this kind and the liquid chemicals that are used are corrosive and heated to high temperatures.

Particulate contaminates are generated in the liquid chemical during the processing of semiconductor wafers or the like and such contaminates may also be present in the initial charge of liquid. Consequently, a continuous flow of liquid is withdrawn from the processing vessel and recirculated back to the vessel through a filter.

My prior copending U.S. patent application Ser. No. 07/434,709 filed Nov. 13, 1989 now U.S. Pat. No. 5,014,737 issued on May 14, 1991, and entitled "Quartz Integrated Trough/Sump Recirculating Filtered High-Purity Chemical Bath", the specification and drawings of which are herein incorporated by reference, discloses a particularly advantageous chemical bath of this type. In the apparatus of that prior application, a sump vessel is situated adjacent one end of the wafer processing vessel and an inclined trough extends along the opposite end and the sides of the processing vessel to deliver overflow from the processing vessel to the sump. A pump draws liquid from the bottom of the sump and recirculates the flow through a filter and into the bottom of the processing vessel. The configuration provides a number of advantages including enabling a very high rate of liquid chemical recirculation while avoiding problems from vortexinq of the flow at the pump intake and from vapor entrainment in the liquid.

In many cases it is desirable that there be a continuing inflow of liquid to the processing vessel from an external source. The external source may, for example, supply an inflow of new liquid chemical to replace liquid losses from such causes as leakage, evaporation or adherence to articles that are withdrawn from the bath. The external source may also be a reprocessor which receives a flow of liquid from the bath and returns purified liquid to the system or may be a source which supplies liquid for still other purposes.

Recirculating chemical baths of this type are adversely affected by variations in the volume of liquid within the bath. Liquid depletion disturbs heat transfer patterns and in extreme cases can cause damaging localized overheating. A build-up of excessive liquid with in the system also has undesirable effects and in extreme cases could result in an overflow. The recirculation system can be a closed loop flow path which inherently returns liquid to the processing vessel at the same rate that liquid is withdrawn from the sump and thus does not in itself have a destabilizing effect. However, inflow of liquid from an external source requires that there be a matching outflow from the bath if liquid volume is to be maintained substantially constant.

The fluid dynamics of a recirculating bath complicate the problem of matching outflow with inflow. Liquid levels in both the processing vessel and the sump undergo pronounced intermittant fluctuations. Immersion of a batch of wafers in the processing vessel causes an abrupt rise of liquid level in the sump. Removal of the batch of wafers causes a temporary lowering of liquid level in the processing vessel followed a slower lowering of liquid level in the sump as the recirculation system returns fluid to the processing vessel. Thus it does not, at first consideration, appear to be feasible to control liquid volume with a liquid level limiting flow outlet at the upper region of the bath. Volume control is further complicated as it is often desirable that the inflow of liquid be adjustable for such purposes as maintaining a desired ratio of flow rates when the recirculation flow is varied by the operator.

Prior arrangements for stabilizing inflow and outflow have resulted in an undesirable complication of chemical bath installations of this general kind. Typically such arrangements are feedback systems which require dynamic valving controlled by flow sensing devices. A less complicated, less costly and more reliable solution would be highly advantageous.

The present invention is directed to overcoming one or more of the problems discussed above.

SUMMARY OF THE INVENTION

In one aspect, the invention provides a chemical bath for immersing articles in a volume of liquid chemical which includes a processing vessel having a flow inlet and an upper edge across which liquid chemical may overflow from the processing vessel. An inclined trough is positioned to deliver the overflow to a sump vessel which has upper and lower flow outlets. The sump vessel has a liquid storage region between the upper and lower outlets which has a volume exceeding the volume of liquid chemical that is displaced from the processing vessel when the articles are immersed in the processing vessel. Pump and filter means withdraw liquid through the lower outlet of the sump vessel and recirculate the withdrawn liquid to the processing vessel in filtered condition. Further means deliver an inflow of liquid chemical to the processing vessel. Outflow of liquid through the upper outlet temporarily increases in response to immersion of articles in the processing vessel and is temporarily interrupted when articles are removed but is equivalent in volume to the inflow over a period of time.

In another aspect of the invention, a chemical bath for immersing products in a volume of hot liquid chemical includes a processing vessel having a flow inlet at the bottom and an openinq at the top that is bounded by a horizontal upper edge of the vessel across which liquid chemical may overflow. Means are present for heating the liquid chemical within the processing vessel. A trough extends along opposite sides and one end of the processing vessel in position to receive the overflow and is inclined to transmit the overflow to a sump reservoir at the other end of the processing vessel. The sump reservoir has a lower flow outlet at its base and an upper flow outlet situated below the level of the upper edge of the processing vessel. The vertical spacing of the upper and lower outlets is sufficient to provide a liquid storage capacity below the upper outlet that is greater than the capacity needed to contain the volume of liquid that overflows from the processing vessel as the products are being immersed in the vessel. Pump and filter means withdraw a first flow of liquid chemical from the lower outlet and return filtered liquid to the flow inlet at the bottom of the processing vessel. Additional means receive an inflow of liquid chemical from a liquid chemical source.

In still another aspect of the invention, the source of the liquid inflow is a reprocessor which receives outflow from the upper outlet of the sump reservoir and returns purified liquid chemical to the processing vessel.

I have recognized that it is not necessary that outflow match inflow at each moment. Minor temporary fluctuations in the volume of liquid which recirculates through the chemical bath can be tolerated without adverse effects. It is only necessary that the amount of liquid that is withdrawn from the bath over a period of time be substantially the same as the amount that enters the bath over that time period. Consequently, it is possible to stabilize the volume of liquid in the bath by situating an outlet for an intermittant outflow at an elevated location in the sump vessel provided that the liquid storage capacity of the sump vessel below the outlet exceeds the volume of liquid that is displaced by articles which are immersed in the bath. Thus outflow can be matched with inflow without the use of flow sensing devices, dynamic flow control valves and other costly and trouble prone control mechanisms.

The invention, together with further aspects and advantages thereof, may be further understood by reference to the following description of the preferred embodiments and by reference to the accompanying drawings.

BRIEF DESCRIPTION OF THE DRAWINGS

FIG. 1 is a perspective view of a chemical bath for immersing batches of semiconductor wafers in a hot liquid chemical during etching, cleaning or other manufacturing operations.

FIG. 2 is a partially broken out side elevation view of the apparatus of FIG. 1 with certain components of the associated liquid flow paths being shown in schematic form.

FIG. 3 is a top view of the apparatus of the preceding figures.

FIG. 4 is a cross section view of the apparatus of the preceding figures taken along line 4—4 of FIG. 3.

FIG. 5 is a schematic depiction of a modified form of the chemical bath apparatus.

DETAILED DESCRIPTION OF THE PREFERRED EMBODIMENTS

Referring initially to FIG. 1, a recirculating chemical bath 11 in accordance with this embodiment of the invention enables the temporary immersion of batches of spaced apart semiconductor wafers 12 in a volume of hot flowing etchant or other liquid chemical 13 during the manufacture of electronic microchips or the like. The wafers 12, wafer carrier 14 and the liquid chemical 13 may be of the known forms and compositions.

Liquid chemical 13 and wafers 12 are contained in a processing vessel 16 which is of generally rectangular configuration in this example and which has a horizontal upper edge 17 extending around the periphery of the vessel and forming a weir across which liquid may overflow from the vessel. The edge 17 preferably has a scalloped or undulating configuration to assure that outflow is evenly distributed around the perphery of the processing vessel 16.

An upwardly opening channel or trough 18 extends along one end 19 and both sides 21 of processing vessel 16 and along opposite sides of a sump vessel or reservoir 22 which is adjacent the other end 23 of the processing vessel. The sump vessel 22 has an open upper end 24 situated below the level of the upper edge 17 of processing vessel 16 and trough 18 inclines downwardly toward end 23 of the processing vessel to carry overflow into the sump vessel. The processing vessel 16, sump vessel 22 and trough 18 are preferably a unitized assembly formed of molded and welded plates of a chemically inert refractory material such as quartz.

Referring jointly to FIGS. 2, 3 and 4, processing vessel 16, sump vessel 22 and trough 18 are supported by a heat resistant, preferably plastic rectangular casing 26. The lower portions of vessels 16 and 22 extend down into casing 26 which is proportioned to be spaced outwardly from the walls and bottom of the vessels to provide a space 27 which is filled with thermal insulation 28. Trough 18 is situated above casing 26 in spaced apart relationship with a flanged rim 29 of the casing. A rectangular quartz flange 31, unitized with the material of vessels 16 and 22, extends outward from the vessels in position to overlap and rest upon rim 29 of the casing 26. Quartz flange 31 is downwardly spaced from trough 18 and has a downwardly directed lip 32 at its outer edge which is laterally spaced from casing rim 29 forming a pocket for receiving sealing mastic 33 which secures and seals the junction of the quartz flange and casing rim 29.

Casing 26 in this embodiment has a downwardly directed leg 34 at each corner to provide space below vessels 16 and 22 for plumbing fittings 36, 37 and 38 which will hereinafter be further discussed.

Liquid chemical 13 is heated by a series of band like electrical heating elements 39 of the resistive type which are disposed against the underside and the lower portions of the outer walls of processing vessel 16.

Components of the liquid chemical recirculation system include pump and filter means 44 which continuously withdraws liquid from sump vessel 22, entraps particulate contaminants and then returns the liquid to processing vessel 16. In particular, the intake of a pump 46 is coupled to a lower flow outlet 47 at the bottom of sump vessel 22 through fitting 36 and a pipe 50 that extends up to the lower outlet. Pump 46 directs the withdrawn liquid through a filter 48 and the filtered flow then travels to a flow inlet 49 at the center of the base of processing vessel 16 through fitting 37 and another pipe 51 that extends up from the fitting to the flow inlet.

Thus pump and filter means 44 create a continuinq upflow of the liquid chemical 13 within processing vessel 16, past the surfaces of the wafers which are to be etched or otherwise treated. The liquid 13 overflows into trough 18 which returns the fluid to sump vessel 22 for repeated recirculation. The bath 11 contains a volume of the liquid chemical 13 that is sufficient to completely fill processing vessel 16 but which does not concurrently completely fill sump vessel 22. This prevents an overfilling of the sump vessel 22 from the sizable surge of processing vessel 16 overflow that occurs each time that a new batch of wafers is being lowered into the processing vessel.

As previously discussed, an inflow of liquid 13 from an external liquid source 52 is often needed for any of various purposes such as supplying make-up liquid to compensate for losses or to enable a small continuous flow of liquid to be withdrawn from bath 11 for repurification and return to the bath 11. The inflow may be varied by the operator or by automatic controls with a flow control valve 53 for such purposes as increasing the inflow if recirculation flow rate is increased and vice versa. This requires a matching outflow of liquid to maintain a substantially constant volume of liquid in the bath 11.

The volume of liquid 13 in bath 11 is stabilized, without substantial complication of the system, by situating an upper flow outlet 54 in sump reservoir 22 at a location which meets certain conditions. In particular, the liquid storage capacity or volume of the sump vessel 22 in the region between the upper and lower flow outlets 54 and 47 should be greater than the volume of liquid 13 that is displaced from processing vessel 22 by the batch of wafers including the wafer carrier as the wafers are immersed in the bath 11. This assures that sufficient liquid 13 is present in sump vessel 22 to avoid pump starvation and to enable pump 44 to refill processing vessel 16 when the batch of wafers is removed. This arrangement further assures that a body of liquid remains present above the lower flow outlet 47 when the sump vessel 22 liquid is at its lowest level. This prevents vortexing at the lower flow outlet which can otherwise impede liquid flow into the outlet 47 and allows entrained vapor to escape from the liquid 13 prior to the time that the liquid enters the outlet. Entrained air or other gases can adversely affect both the pumping and filtering operations.

Another condition which should be met is to situate the upper flow outlet 54 at a location where it does not intercept any of the liquid 13 overflow from processing vessel 16 as it is entering the sump vessel 22 or to shield the outlet from the overflow.

The upper flow outlet 54 can be situated in a wall of sump vessel 22 or take a variety of forms but is preferably an opening in the sidewall Of a vertical standpipe 56 in the sump vessel. Standpipe 56 is closed at the top, located near one corner of the sump vessel 22 and the upper outlet 54 faces away from the nearby portion of trough 18. This construction minimizes plumbing complications as the standpipe 56 can be communicated with the third fitting 38 through a horizontal pipe 57 at the base of casing 26.

The external source 52 of liquid inflow in this embodiment of the invention is a liquid reprocessor of one of the known types which receives a relatively small flow of the liquid 13 for repurification and return to the chemical bath 11. In this context, the outflow liquid 13 from fitting 38 is delivered to a reservoir 58 from which the reprocessor 52 draws liquid that is to be repurified.

In other embodiments of the invention, the external source 52 of inflow to the chemical bath 11 may not be a reprocessor that receives the outflow from the bath and may deliver liquid 13 to the bath for other purposes. Referring to FIG. 5, for example, external source 52 may be a make-up liquid supply that provides a small continuous inflow to the bath 11 to compensate for losses from such causes as leakage, evaporation and adherence of liquid to batches of wafers as they are removed. The outflow of liquid from fitting 38 need not necessarily be returned to the bath 11 and in this instance is simply discharged into a waste receptacle 59.

In operation and with reference to all figures of the drawings, inflow of liquid 13 from the external source 52 may be continuous but outflow through the upper outlet 54 is discontinuous. Under steady state conditions, upper flow outlet 54 limits the liquid level in sump vessel 22 and outflow matches inflow from the external source 52 of liquid 13. Immersion of a batch of wafers 12 in processing vessel 16 displaces a volume of liquid 13 and causes a temporary rise of liquid level in sump Vessel 22. Outflow then temporarily increases until the liquid level is brought down to the level of the lower edge of upper flow outlet 54 at which point the steady state condition is resumed. Removal of the batch of wafers 12 is followed by a temporary cessation of outflow since liquid level in processing vessel 16 drops abruptly and overflow into the sump vessel temporarily ceases while pump 46 continues to recirculate liquid from the sump vessel back to the processing vessel. This cycle is repeated upon immersion of the next batch of wafers 12 or, if the next immersion is delayed, inflow from the external source 52 eventually restores the steady state condition.

The temporary rise of outflow which occurs in response to immersion of a batch of wafers 12 is compensated for by the temporary cessation of outflow which follows removal of the batch of wafers. Thus, over a period of time, the intermittent outflow matches the continuous inflow and the volume of liquid 13 in the bath 11 remains essentially stable.

While the invention has been described with reference to certain specific embodiments for purposes of example, many modifications and variations are possible and it is not intended to limit the invention except as defined in the following claims.

I claim:

1. A chemical bath for immersing articles in a volume of liquid chemical comprising:
   a processing vessel for receiving said liquid chemical and said products, said processing vessel having a flow inlet and an upper edge across which liquid chemical may overflow from said processing vessel,
   an inclined trough positioned to receive said overflow from said processing vessel,
   a sump vessel positioned to receive said overflow from said trough and having upper and lower vertically spaced flow outlets, said sump vessel having a liquid storage region between said upper and lower outlets that has a Volume which exceeds the volume of liquid chemical that is displaced from said processing vessel as said products are immersed therein,
   pump and filter means for withdrawing liquid chemical through said lower outlet of said sump vessel and for recirculating the withdrawn liquid chemical to said processing vessel in filtered condition, and
   means for delivering an inflow of liquid chemical to said bath,
   whereby outflow of liquid chemical through said upper outlet of said sump vessel temporarily increases in response to immersion of said articles and is temporarily interrupted when said product is removed from said processing vessel but is substantially equivalent in volume to said inflow over a period of time.

2. The apparatus of claim 1 wherein said means for delivering an inflow of liquid chemical provides an inflow of fresh unrecirculated liquid chemical to said processing vessel.

3. The apparatus of claim 1 wherein said means for delivering an inflow of liquid chemical receives at least a portion of the liquid chemical which flows out through said upper outlet of said sump vessel and repurifies the received liquid chemical for return to said processing vessel.

4. The apparatus of claim 1 further including means for discharging said outflow of liquid chemical from said apparatus.

5. The apparatus of claim 1 wherein said upper outlet of said sump vessel is positioned away from the flow path along which said overflow from said processing vessel enters said sump vessel.

6. The apparatus of claim 1 wherein said sump vessel is situated adjacent said processing vessel, said upper edge of said processing vessel across which liquid chemical may overflow being substantially continuous around the periphery of the upper end of said processing vessel and wherein said trough extends along opposite sides of both said processing vessel and said sump vessel and along the end of said processing vessel that is remote from said sump vessel, said upper outlet of said sump vessel being spaced apart from said opposite sides of said sump vessel and from the portions of said trough which extend therealong.

7. The apparatus of claim 1 wherein said volume of said liquid storage region in said sump vessel exceeds said volume of said displaced liquid by an amount sufficient to maintain a body of liquid chemical above said lower outlet of said sump vessel after said products are removed from said processing vessel and overflow from said processing vessel temporarily ceases.

8. The apparatus of claim 7 wherein said body of liquid is of sufficient height to avoid vortexing at said lower outlet of said sump vessel and to enable escape of entrained vapor from said liquid chemical prior to entry of said liquid chemical into said lower outlet.

9. The apparatus of claim 1 wherein said upper outlet of said sump vessel is spaced below said upper edge of said processing vessel.

10. The apparatus of claim 1 wherein said upper outlet of said sump vessel is defined by a vertical standpipe which extends upward within said sump vessel from the bottom thereof.

11. The apparatus of claim 10 wherein said standpipe has a closed upper end and said upper outlet is defined by an opening in the sidewall of said standpipe.

12. A chemical bath for immersing products in a volume of hot liquid chemical comprising:
a processing vessel for receiving said liquid chemical and said products, said processing vessel having a flow inlet at the bottom thereof and an opening at the top thereof that is bounded by a horizontally extending upper edge of the vessel across which liquid chemical may overflow therefrom,
means for transmitting heat to liquid chemical which is contained within said processing vessel,
a trough extending along opposite sides and one end of said processing vessel below said upper edge thereof in position to receive said overflow, said trough being inclined to transmit said overflow toward the other end of said processing vessel,
a sump reservoir disposed adjacent said other end of said processing vessel in position to receive said overflow from said trough, said sump reservoir having a lower flow outlet at the base thereof and an upper flow outlet situated below the level of said upper edge of said processing vessel, the vertical spacing of said upper outlet from said lower outlet being sufficient to provide a liquid storage capacity below said upper outlet which is greater than that needed to contain the volume of liquid which overflows from said processing vessel as said products are being immersed therein,
pump and filter means for withdrawing liquid chemical from said sump reservoir through said lower outlet and for filterinq the withdrawn liquid chemical which means returns the filtered liquid chemical to said processing vessel through said flow inlet thereof, and
means for receiving an inflow of liquid chemical from a liquid chemical source.

13. The apparatus of claim 12 further including a liquid chemical reprocessor which receives liquid chemical that is discharged from said sump vessel through said upper outlet thereof, said reprocessor being said liquid chemical source and said inflow of liquid chemical being liquid chemical which has been reprocessed by said reprocessor.

* * * * *